(12) United States Patent
Jin et al.

(10) Patent No.: US 9,320,149 B2
(45) Date of Patent: Apr. 19, 2016

(54) BUMPLESS BUILD-UP LAYER PACKAGE INCLUDING A RELEASE LAYER

(71) Applicant: Intel Corporation, Santa Clara, CA (US)

(72) Inventors: Liwen Jin, Chandler, AZ (US); Dilan Seneviratne, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 436 days.

(21) Appl. No.: 13/725,104

(22) Filed: Dec. 21, 2012

(65) Prior Publication Data
US 2014/0177193 A1 Jun. 26, 2014

(51) Int. Cl.
| | |
|---|---|
| *H05K 1/18* | (2006.01) |
| *H05K 3/46* | (2006.01) |
| *H01L 23/538* | (2006.01) |

(Continued)

(52) U.S. Cl.
CPC ............ *H05K 1/185* (2013.01); *H01L 21/6835* (2013.01); *H01L 23/49822* (2013.01); *H01L 23/49894* (2013.01); *H01L 23/5389* (2013.01); *H01L 24/19* (2013.01); *H05K 3/4682* (2013.01); *H01L 2221/68345* (2013.01); *H01L 2224/04105* (2013.01); *H01L 2224/73267* (2013.01); *H05K 2203/0152* (2013.01)

(58) Field of Classification Search
CPC ... H05K 1/183; H05K 13/0023; H05K 1/185; H05K 2203/0152; H01L 23/5389; H01L 23/49822; H01L 23/49894; H01L 21/6835; H01L 2221/68345
See application file for complete search history.

(56) References Cited

U.S. PATENT DOCUMENTS

| | | | | |
|---|---|---|---|---|
| 6,232,151 | B1 * | 5/2001 | Ozmat et al. | 438/122 |
| 6,274,937 | B1 * | 8/2001 | Ahn et al. | 257/777 |

(Continued)

FOREIGN PATENT DOCUMENTS

| | | |
|---|---|---|
| CN | 101192550 A | 6/2008 |
| CN | 104137230 A | 11/2014 |

(Continued)

OTHER PUBLICATIONS

"International Application Serial No. PCT/US2013/044069, International Search Report mailed Sep. 13, 2013", 3 pgs.

(Continued)

*Primary Examiner* — David M Sinclair
*Assistant Examiner* — Theron Milliser
(74) *Attorney, Agent, or Firm* — Schwegman Lundberg & Woessner, P.A.

(57) ABSTRACT

An example includes a die package including a microelectronic die having a lower die surface, an upper die surface parallel to the lower die surface, and a die side, the microelectronic die including an active region and an inactive region. The example optionally includes a release layer having a lower release layer surface, an upper release layer surface parallel to the lower release layer surface, and at least one release layer side, the release layer coupled with the upper surface of the microelectronic die in thermal communication with the inactive region of the die and electrically insulated from the active region. The example optionally includes an encapsulation material encapsulating the die side and the release layer side and lower release layer surface, the encapsulation material including a lower surface substantially parallel to the die lower surface and an upper surface substantially parallel to the die upper surface.

14 Claims, 10 Drawing Sheets

(51) Int. Cl.
*H01L 23/498* (2006.01)
*H01L 21/683* (2006.01)
*H01L 23/00* (2006.01)

(56) References Cited

U.S. PATENT DOCUMENTS

| | | | | |
|---|---|---|---|---|
| 6,438,281 | B1* | 8/2002 | Tsukamoto et al. | 385/14 |
| 6,440,566 | B1* | 8/2002 | Maligie et al. | 428/412 |
| 6,884,652 | B2* | 4/2005 | Huang et al. | 438/106 |
| 7,508,352 | B2 | 3/2009 | Lempkowski et al. | |
| 7,759,163 | B2* | 7/2010 | Kroeninger et al. | 438/113 |
| 7,767,495 | B2* | 8/2010 | Fuergut et al. | 438/110 |
| 8,264,849 | B2* | 9/2012 | Guzek | 361/764 |
| 8,304,913 | B2* | 11/2012 | Nalla et al. | 257/774 |
| 8,372,689 | B2* | 2/2013 | Lee et al. | 438/107 |
| 8,421,245 | B2* | 4/2013 | Gonzalez et al. | 257/777 |
| 8,604,605 | B2* | 12/2013 | Nystrom et al. | 257/704 |
| 8,633,551 | B1* | 1/2014 | Teh et al. | 257/414 |
| 8,736,065 | B2* | 5/2014 | Gonzalez et al. | 257/774 |
| 8,848,380 | B2* | 9/2014 | Malatkar et al. | 361/746 |
| 8,937,382 | B2* | 1/2015 | Teh et al. | 257/701 |
| 2002/0137263 | A1* | 9/2002 | Towle et al. | 438/127 |
| 2003/0214027 | A1* | 11/2003 | Nishitani et al. | 257/700 |
| 2004/0146684 | A1 | 7/2004 | Yoshida | |
| 2007/0164905 | A1 | 7/2007 | Lempkowski et al. | |
| 2007/0235218 | A1* | 10/2007 | Miyamoto et al. | 174/261 |
| 2008/0054448 | A1* | 3/2008 | Lu et al. | 257/707 |
| 2009/0072357 | A1* | 3/2009 | Tang et al. | 257/659 |
| 2009/0075428 | A1* | 3/2009 | Tang et al. | 438/114 |
| 2009/0102066 | A1* | 4/2009 | Lee et al. | 257/784 |
| 2009/0283895 | A1 | 11/2009 | Kikuchi et al. | |
| 2010/0193928 | A1* | 8/2010 | Zudock et al. | 257/686 |
| 2010/0314744 | A1* | 12/2010 | Huang et al. | 257/690 |
| 2010/0320593 | A1* | 12/2010 | Weng et al. | 257/693 |
| 2011/0049707 | A1 | 3/2011 | Seto et al. | |
| 2011/0108999 | A1* | 5/2011 | Nalla et al. | 257/784 |
| 2011/0127654 | A1* | 6/2011 | Weng et al. | 257/660 |
| 2011/0169150 | A1* | 7/2011 | Su et al. | 257/675 |
| 2011/0241215 | A1* | 10/2011 | Sankman et al. | 257/773 |
| 2011/0254124 | A1* | 10/2011 | Nalla et al. | 257/531 |
| 2012/0009738 | A1 | 1/2012 | Crawford et al. | |
| 2012/0074581 | A1* | 3/2012 | Guzek et al. | 257/774 |
| 2012/0139116 | A1* | 6/2012 | Manusharow et al. | 257/762 |
| 2013/0270719 | A1* | 10/2013 | Malatkar et al. | 257/777 |
| 2014/0090879 | A1* | 4/2014 | Seneviratne et al. | 174/257 |
| 2014/0332252 | A1* | 11/2014 | Lin | 174/251 |

FOREIGN PATENT DOCUMENTS

| | | |
|---|---|---|
| JP | 7182989 A | 7/1995 |
| KR | 1020120036044 A | 10/2013 |
| WO | WO-2014098965 A1 | 6/2014 |

OTHER PUBLICATIONS

"International Application Serial No. PCT/US2013/044069, Written Opinion mailed Sep. 13, 2013", 5 pgs.
"International Application Serial No. PCT/US2013/044069, International Preliminary Report on Patentability mailed Jul. 2, 2015", 7 pgs.
"Chinese Application Serial No. 201380011202.X, Office Action mailed Feb. 1, 2016", 8 pgs.

* cited by examiner

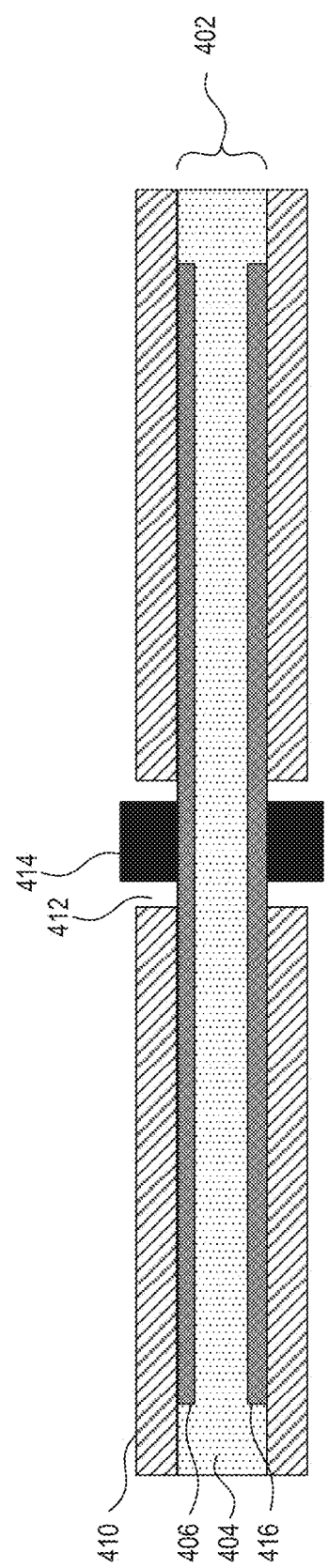

BUMPLESS BUILD-UP LAYER PACKAGE INCLUDING A RELEASE LAYER

TECHNICAL FIELD

Examples generally relate to packaged integrated circuits, and more specifically to a bumpless build-up layer package including a release layer.

TECHNICAL BACKGROUND

Processors and other integrated circuit chips can be built up using a layer, such as a copper, that is later removed. Such removal is inefficient and can generate undesirable waste. Accordingly, structures and processes that do not rely on such layers are desired. Replacement processes should also reduce material waste.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates a cross-section view of a die including an organic layer patterned onto a copper layer, according to an example.

DETAILED DESCRIPTION

Examples in this disclosure relate to a process for forming a release layer into a package that optionally includes bumpless build-up layers. Examples also relate to methods of assembling a bumpless build-up layer package including a release layer.

The following description includes terms, such as upper, lower, first, second, etc. that are used for descriptive purposes only and are not to be construed as limiting. The examples of an apparatus or article described herein can be manufactured, used, or shipped in a number of positions and orientations. The terms "die" and "chip" generally refer to the physical object that is the basic workpiece that is transformed by various process operations into the desired circuit device. A die is usually singulated from a wafer and wafers may be made of semiconducting, non-semiconducting, or combinations of semiconducting and non-semiconducting materials. A board is typically a resin-impregnated fiberglass structure acting as a mounting substrate for the die. Such a substrate can be an interconnect substrate, such as a coreless substrate. A release layer in this disclosure is a thin structure that is integrated, including by being built-up into a package.

Reference will now be made to the drawings wherein like structures will be provided with like suffix reference designations. In order to show the structures of various examples clearly, the drawings included herein are diagrammatic representations of circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1:
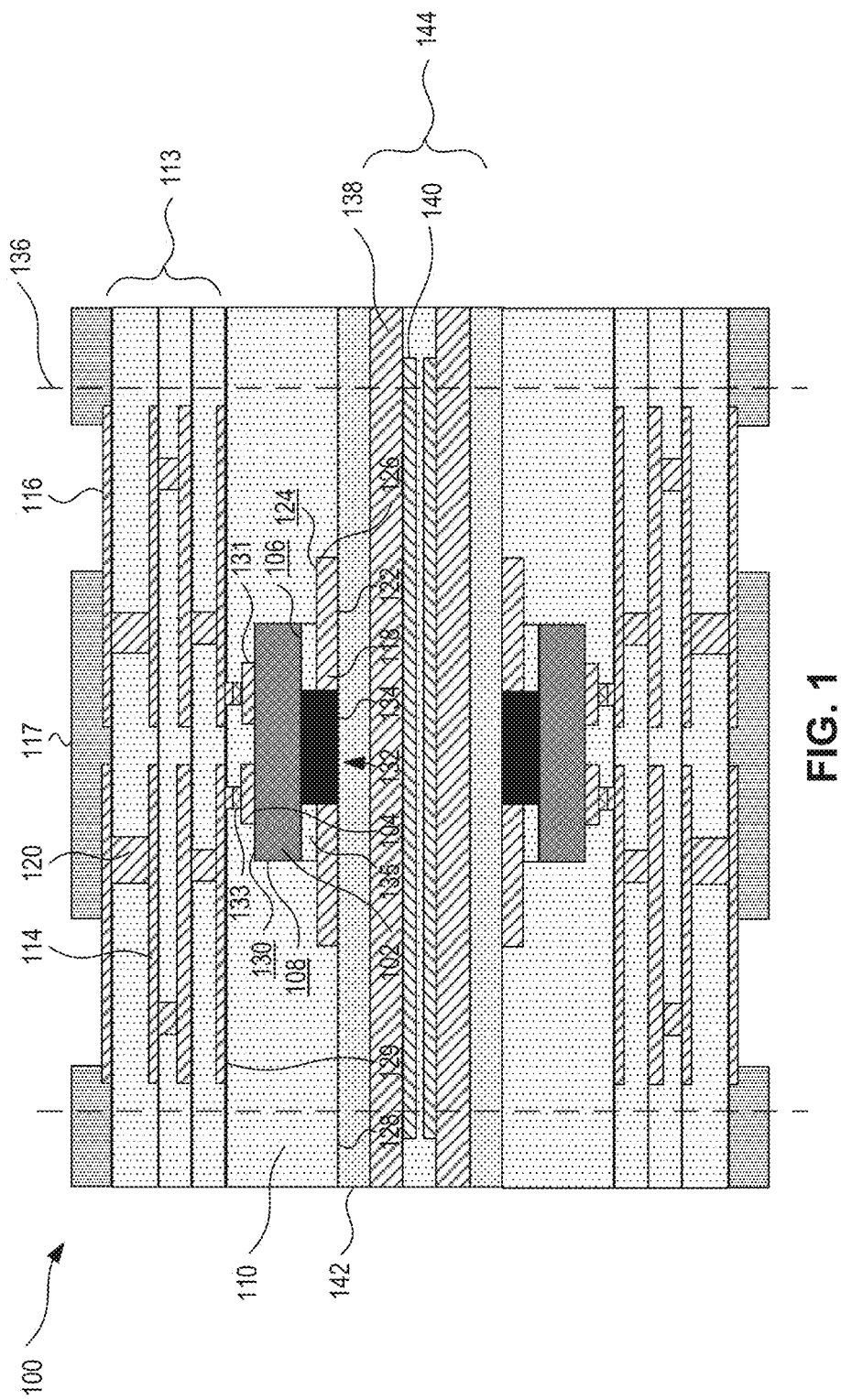
FIG. 1 illustrates a cross-section view of a die, according to an example.

FIG. 1 illustrates a cross-section view of a die, according to an example. Microelectronic die 102 can be any type of integrated circuit die. The microelectronic die 102 can be a multi-core microprocessor. The assembly 100 can be constructed as a bump-less build-up layer (BBUL) package.

The microelectronic die 102 can include an active region, which can include an active surface such as upper surface 104. The active region can extend to multiple sides of the die 102. The microelectronic die 102 can include an upper surface 104 which contains the electrical connections 131 to operate microelectronic die 102. Materials 133, such as build-up films, solder and the like can be used to connect the electrical connections 131 to conductive traces 114 as disclosed herein.

The die 102 can include a microelectronic die inactive region that can include an inactive surface such as lower surface 106. The inactive region can extend to multiple sides of the die 102. A lower surface 106 can be parallel to upper surface 104. The die 102 can include a die side 108. The die side 108 can extend between the upper surface 104 and the lower surface 106.

The package 100 can include encapsulation material 110. The package 100 can include build-up layers 113. The encapsulation material 110 can be formed of the same material as the build-up layers 113. One or more of the build-up layers or the encapsulation layer can be selected to have different materials to balance stresses that may occur due to stresses incurred in manufacturing or use.

The package 100 can include one or more conductive traces 114. The package can include conductive contacts 116. A mask 117 can define the contacts. The mask 117 can comprise a build-up layer. The package 100 can include one or more interconnects 120. Encapsulation material, as used herein, can include one or more build-up layers. In some examples, such as to reduce or control warpage, a thin layer of encapsulation material can be embedded within a build-up layer.

A cavity defining layer 118 can be integrated into the package 100. The cavity defining layer 118 can include a lower cavity defining layer surface 122. An upper cavity defining layer surface 124 can be parallel to the lower cavity defining layer surface 122. The cavity defining layer can include at least one cavity defining layer side 126. The cavity defining layer 118 can be disposed proximal the lower surface 106 of the microelectronic die 102. The cavity defining layer 118 can be in thermal communication with the die 102, such by contacting or being coupled with an inactive region of the die. The cavity defining layer 118 can comprise an electrically conductive material. The cavity defining layer 118 can be electrically insulated from the active region of the die 102.

The encapsulation material 110 can define a cavity between the cavity defining layer 118 and the microelectronic die 102. As illustrated, the cavity defining layer 118 can optionally define a cavity defining layer opening 132 with the lower surface of the die exposed through the cavity defining layer opening. The cavity defining layer opening 132 can open to the cavity, such as a cavity shaped to receive thermal interface material.

A thermal interface material 134 can be disposed between, and in thermal communication with, the upper cavity defining layer surface 124 and the lower die surface 106. The cavity defining layer 118 can define an opening 132 exposing at least a portion of the thermal interface material 134 to a lower surface 128 of the package 100.

The microelectronic die 102 can be held in place on at least one side 108 by encapsulation material 110. The die 102 can be coupled, such as through adhesion, such as with a panel, such as the cavity defining layer 118, using an material having adhesive properties, such as die bonding film ("DBF") 135. The DBF can comprise a thermal interface material. The DBF can be disposed along the lower surface 106. The encapsulation material 110 can be to control package warpage, such as by selecting a material having a coefficient of thermal expansion selected to offset expansion or contraction of other materials proximal to the encapsulation material, such as the die 102.

The encapsulation material 110 can include a lower surface 128 that is substantially parallel to the die lower surface 106. The encapsulation material 110 can include an upper surface 130 that is substantially parallel to the die upper surface 104. The encapsulation material 110 can include at least one surface substantially planar to upper surface 104. There can be an opening in the encapsulation material 110 extending to a portion of the die, such as to the illustrated upper portion. The encapsulation material 110 can include at least one upper encapsulation material surface 129 substantially planar to lower surface 104. There can be an opening in the encapsulation material 110 extending to a portion of the die, such as to the illustrated lower portion. The upper surface 104 can be placed on a holding plate while encapsulation material 110 is disposed around microelectronic die 102. The encapsulation material 110 can encapsulate the die side 108 and the cavity defining layer side 126 and upper cavity defining layer surface 124.

Build-up layers 113 can be coupled with the encapsulation material 110. Encapsulation material 110 can be built up as are the build-up layers 113. Conductive traces 114 can be coupled with the build-up layers 113. The traces 114 and can be in electrical contact with upper surface 104. Conductive contacts 116 couple with conductive traces 114 and allow integrated circuit package 100 to be electrically coupled, for example by a socket connection, to a circuit board. In one example, conductive contacts 116 can include solder balls. Conductive contacts 116 can include lands or pins.

A coreless carrier 144 can be provided as a panel and can be combined with resin layers 138 and a conductor 126, such as copper, to form a cavity, such as a cavity in which thermal interface material can be disposed. The resin layers can comprise an etch stop layer. The coreless carrier 144 can include a sacrificial short foil 140 and a sacrificial long foil 138. Examples of resin layers include, but are not limited to, a dielectric material such as a material having a low Young's Modulus, such as an Ajinomoto Build-up Film (ABF) dielectric material, including, but not limited to, GX-92, T-31 and other materials, each optionally combined with one or more fillers. One or more of these materials is manufactured by Ajinomoto Fine-Techno Co., Inc.

The assembly 100 can be cut, such as along cut lines 136, to separate a top portion from a bottom portion. Cutting can include routing. A vacuum can be formed between the outer copper layer 138 and an inner copper layer 140 during manufacturing, such that the outer copper layer 138 is free to move away from the inner copper layer 140 once the assembly is cut.

Unfortunately, the outer copper layer 138 can remain on the resin layer 142. It is desirable to remove this outer copper layer 138, at least to safe space. The layer can be etched off, which can be time consuming, expensive, and which can lead to waste.

Figure 2:
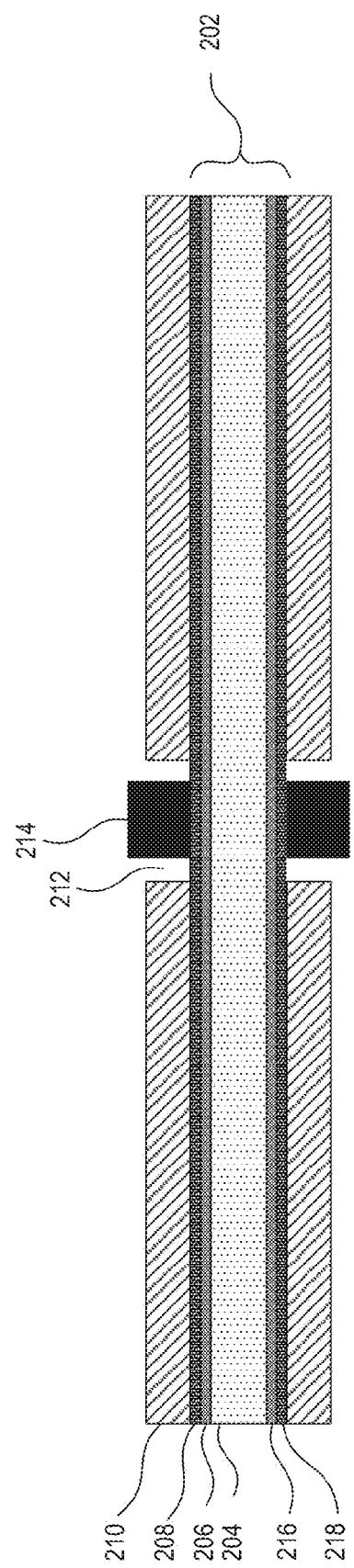
FIG. 2 illustrates a cross-section view of a die packaged with a release layer, according to an example.

Accordingly, some assemblies disclosed herein are formed using a release layer. FIG. 2 illustrates a cross-section view of a die packaged with a release layer, according to an example. A core panel 202 includes a substrate 204 such as pre-impregnated composite ("prepreg"). The substrate can include one of an organic composite, an inorganic composite, a combination of organic and inorganic composites and a monolithic layer.

A release layer 206 can be coupled with the substrate 204, such as above and/or below the substrate 204. The release layer 206 can be adhered to the substrate 204 with a mechanism such as a weak adhesion bond. Such a bond can include intermolecular forces and/or controlled type of chemical bonding. The weak adhesion bond can be less than 0.2 kilogram-force per centimeter.

An resin layer 208 can be coupled with the release layer 206, such as above the release layer 206. The resin layer 208 can be adhered to the release layer with a weak adhesion bond.

A metal film 210, such as a copper file, can be coupled with the resin layer 208, such as above the resin layer. The metal film 210 can define a cavity 212. A microelectronic die 214 can be coupled with the metal film in the cavity. The die can be the die 102 of FIG. 1. An assembly can be constructed above the metal film 210 that is similar to the assembly 100 above cavity defining layer 118 of FIG. 1. Build-up layers and traces, such as build-up layers 113 in FIG. 1, can be disposed onto the metal film 210.

A bottom release layer 216 can be coupled with the substrate 204, such as below the substrate 204. The bottom release layer can be adhered to the substrate 204, such as with a weak adhesion bond. A bottom resin layer 218 can be coupled with the release layer 216, such as below the release layer. The resin layer 218 can be coupled with the substrate. A bottom metal film can be coupled with the resin layer, below the resin layer, the metal film defining a cavity. A bottom microelectronic die can be coupled with the metal film in the cavity.

The metal films discussed herein can include copper. The copper can be around 10 to 210 microns thick. The copper can be around 18-35 microns thick. The resin layer discussed herein can be around 10 to 100 microns thick. The release layer discussed herein can be less than around 1 micron thick.

Figure 3:
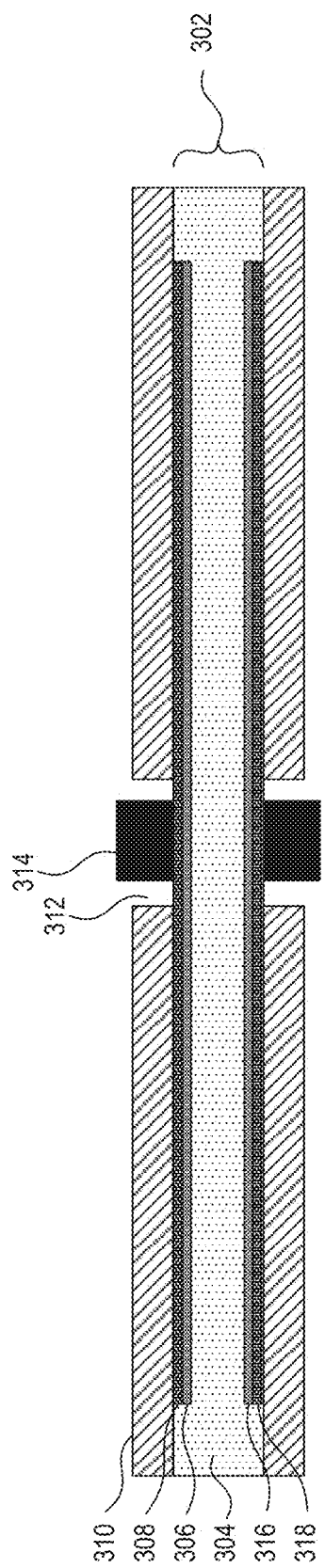
FIG. 3 illustrates a cross-section view of a die packaged with a release layer, with copper abutting substrate, according to an example.

FIG. 3 illustrates a cross-section view of a die packaged with a release layer, with copper abutting substrate, according to an example. A core panel 302 includes a substrate 304 such as pre-impregnated composite ("prepreg"). A release layer 306 can be coupled with the substrate 304, such as above and/or below the substrate 304. The release layer 306 can be adhered to the substrate 304 with a weak adhesion. The weak adhesion bond can be less than 0.2 kilogram-force per centimeter. An resin layer 308 can be coupled with the release layer 306, such as above the release layer 306. The resin layer 308 can be adhered to the release layer with a weak adhesion bond. A metal film 310, such as a copper file, can be coupled with the resin layer 308, such as above the resin layer. The metal film 310 can define a cavity 312. A microelectronic die 314 can be coupled with the metal film in the cavity. The die can be the die 102 of FIG. 1. An assembly can be constructed above the metal film 310 that is similar to the assembly 100 above cavity defining layer 118 of FIG. 1. Build-up layers and traces, such as build-up layers 113 in FIG. 1, can be disposed onto the metal film 310.

A bottom release layer 316 can be coupled with the substrate 304, such as below the substrate 304. The bottom release layer can be adhered to the substrate 304, such as with a weak adhesion bond. A bottom resin layer 318 can be coupled with the release layer 316, such as below the release layer. The resin layer 318 can be coupled with the substrate. A bottom metal film can be coupled with the resin layer, below the resin layer, the metal film defining a cavity. A bottom microelectronic die can be coupled with the metal film in the cavity.

A portion of the metal film 310 can abut the substrate 304, the portion surrounding the release layer 306. For example, the release layer 306 can be rectilinear, and the substrate can abut the metal film 310 around the release layer 306, the abutment also being rectilinear. The metal film can be copper and the substrate can be a pre-impregnated composite, and a bond between them has a peel strength of around 3.8 kilogram-force per centimeter.

FIG. 4 illustrates a cross-section view of a die including an organic layer patterned onto a copper layer, according to an example. A core panel 402 includes a substrate 404 such as pre-impregnated composite ("prepreg"). An organic layer 406 can be coupled with the substrate 404, such as above and/or below the substrate 404. The organic layer 406 can include resin and release. A metal film 410, such as a copper file, can be coupled with the resin layer 408, such as above the resin layer. The metal film 410 can define a cavity 412. A microelectronic die 414 can be coupled with the metal film in the cavity. The die can be the die 102 of FIG. 1. An assembly can be constructed above the metal film 410 that is similar to the assembly 100 above cavity defining layer 118 of FIG. 1. Build-up layers and traces, such as build-up layers 113 in FIG. 1, can be disposed onto the metal film 410.

The organic layers 406, 416 can be deposited on the metal film 410, such as by printing, such as with a spray nozzle. The organic layers 406, 416, alternatively, can be rolled onto the metal film.

Figure 5A:
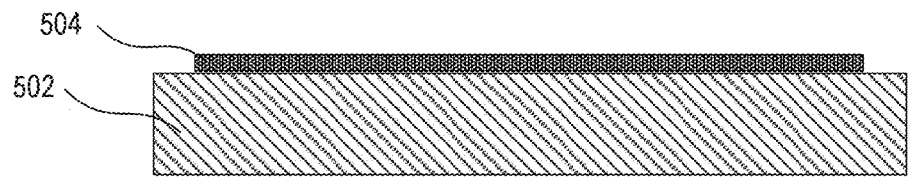
FIG. 5A illustrates a first step in building up a package, showing a cross-section view of a substrate with an resin disposed thereon, according to an example.
Figure 5B:
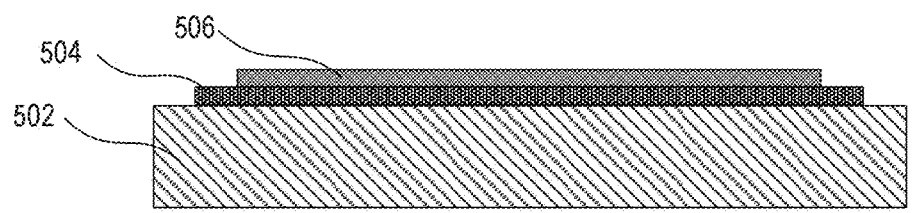
FIG. 5B illustrates a second step in building up a package, showing a cross-section view of a substrate with a release disposed on the resin of FIG. 5A.

FIG. 5A illustrates a first step in building up a package, showing a cross-section view of a substrate with an resin disposed thereon, according to an example. FIG. 5B illustrates a second step in building up a package, showing a cross-section view of a substrate with a release disposed on the resin of FIG. 5A. A metal film 502 can have an resin 504 coupled thereon, such as through printing resin material 504 onto the metal film 502. A release layer 506 can be printed onto the resin layer 504, such as by printing.

Figure 6:
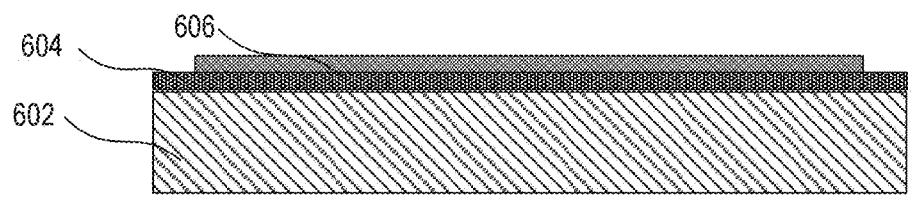
FIG. 6 illustrates a cross-section view of a substrate with an resin disposed coextensively on top of copper, according to an example.

FIG. 6 illustrates a cross-section view of a substrate with an resin disposed coextensively on top of copper, according to an example. In this variation the resin layer 604 is coextensive with the metal foil 602 along a perimeter. The release layer 606 is disposed on the resin layer 604 inside the perimeter.

Figure 7:
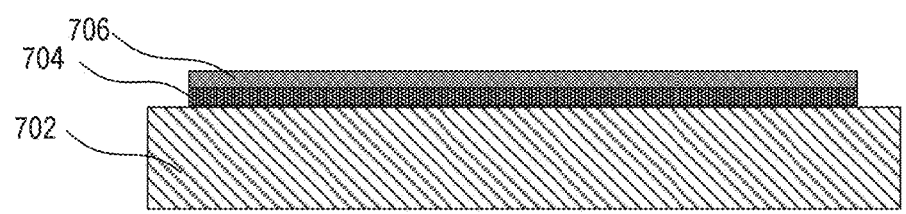
FIG. 7 illustrates a cross-section view of a substrate with an resin disposed coextensively with release, with both disposed on top of copper, according to an example.

FIG. 7 illustrates a cross-section view of a substrate with an resin disposed coextensively with release, with both disposed on top of copper, according to an example. In this variation the resin layer 604 is inside a perimeter of the metal foil 602. The release layer 606 is disposed on the resin layer 604 coextensive therewith.

Figure 8:
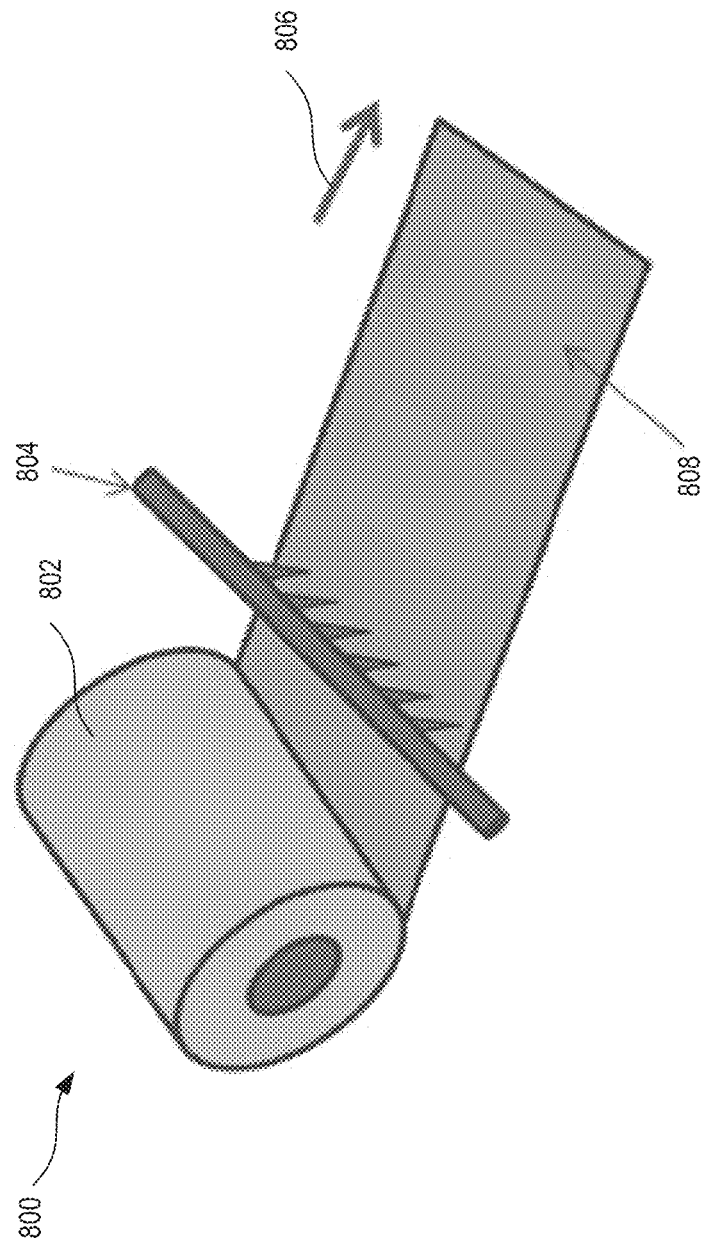
FIG. 8 is a diagram representing a method of spraying material onto copper, according to an example.

FIG. 8 is a diagram representing a method of spraying material onto copper, according to an example. A roll process 800 includes a metal foil 802 that can be unrolled. As it is unrolled, it can be advanced 806 under a spray head 804 that deposits patterns on the metal foil. The patterns can include an organic layer, such as an resin or a release layer.

Figure 9:
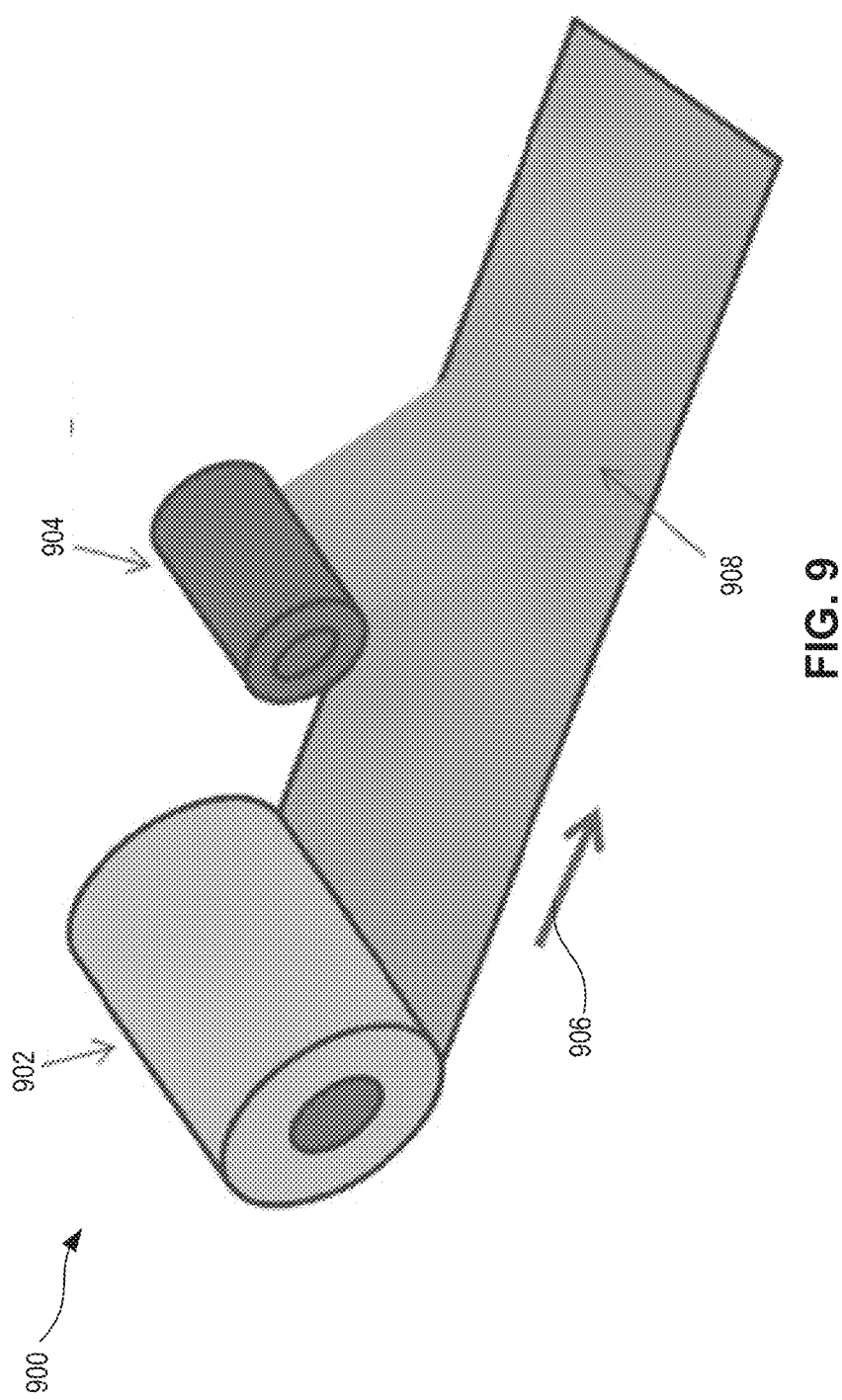
FIG. 9 is a diagram representing a method of rolling material onto copper, according to an example.

FIG. 9 is a diagram representing a method of rolling material onto copper, according to an example. A roll process 900 includes a metal foil 902 that can be unrolled. As it is unrolled, it can be advanced 906 under another roll 904 that deposits patterns on the metal foil. The patterns can include an organic layer, such as an resin or a release layer.

Figure 10:
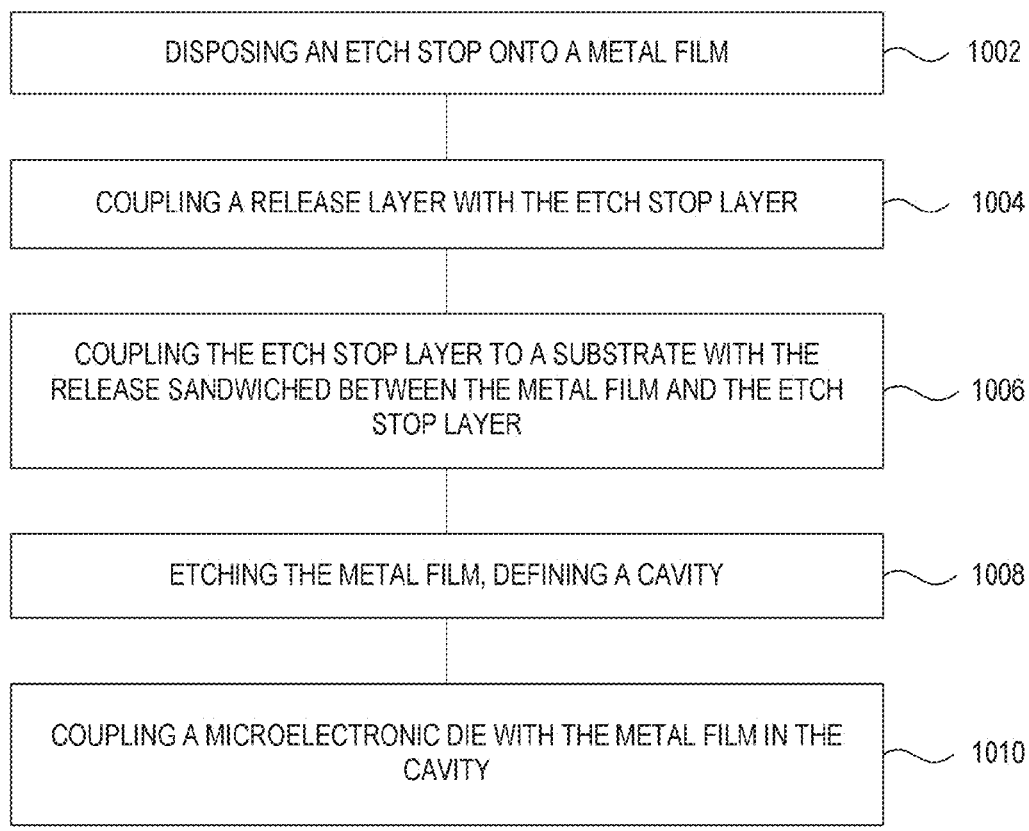
FIG. 10 is a method of constructing a portion of a die package, according to an example.

FIG. 10 is a method of constructing a portion of a die package, according to an example. At 1002, the method can include coupling an resin layer onto a metal film. At 1004, the method example can include coupling a release layer onto the resin layer. At 1006, the method example can include coupling the resin layer to a substrate with the release sandwiched between the metal film and the resin layer. Such a method can provide either of the structures of FIGS. 2 and 3. In the case of FIG. 2, bonding forces can hold the substrate, release and resin together. An example includes adhering the release layer to a substrate with a weak adhesion bond. In the case of FIG. 3, the release layer need not be bonded to the resin layer. At 1008, the method example can include etching the metal film, defining a cavity. At 1010, the method example can include coupling a microelectronic die onto the metal film, inside the cavity.

A number of optional methods are possible, and can be combined with those illustrated in FIG. 10. A method is included wherein coupling the resin layer onto the metal film can include spraying the resin layer onto the metal film.

A method example is included wherein coupling the resin layer onto the metal film can include spraying the resin layer onto the metal film in a pattern that covers less than an entire surface of the metal film. A method example can include coupling the release layer onto the resin layer in a patter than covers and entire exposed surface of the resin layer.

A method example is included wherein coupling the resin layer onto the metal film can include rolling the resin layer from a roll of resin layer onto the metal film. A method example is included wherein coupling the resin layer onto the metal film can include rolling the resin layer onto the metal film in a pattern that covers less than an entire surface of the metal film, including periodically cutting the roll.

A method example can include coupling a primer on the resin layer. A method example is included wherein coupling the release layer onto the resin layer can include coupling the release layer onto the primer.

A method of packaging a microelectronic die can include coupling a top resin onto a top metal film. A method example can include coupling a top release layer onto a top resin layer. A method example can include coupling a bottom resin onto a bottom metal film. A method example can include coupling a bottom release layer onto a bottom resin layer. Adhering the top release layer to a top surface of a substrate with a weak adhesion bond. Adhering the bottom release layer to a bottom surface of a substrate with a weak adhesion bond. A method example can include etching the top metal film, defining a top cavity. A method example can include etching the bottom metal film, defining a bottom cavity. A method example can include coupling a top microelectronic die on the top metal film in the top cavity. A method example can include coupling a bottom microelectronic die on the bottom metal film in the bottom cavity.

A method example can include cutting the top metal film, top release layer, top resin, bottom metal film, bottom release layer, bottom resin and substrate, with a cut line disposed between a portion of the top resin layer that can be can be coupled with the substrate and between a portion of the bottom resin layer that can be can be coupled with the substrate.

A method example can include overcoming the weak adhesion bond separating the top release layer from the top surface of the substrate. A method example can include overcoming the weak adhesion bond separating the bottom release layer from the bottom surface of the substrate.

A method example is included wherein adhering the top release layer to a top surface of a substrate with a weak adhesion bond can include pressing the top release layer to the top surface of the substrate under a pressure at a temperature in excess of an ambient temperature, and wherein adhering the bottom release layer to a bottom surface of a substrate with a weak adhesion bond can include concurrently pressing the bottom release layer to the bottom surface of the substrate under the same pressure and temperature.

A method example can include encapsulating the top die in the top cavity, and encapsulating the bottom die in the bottom cavity. A method example can include building up build-up layers onto the top metal film and the bottom metal film. A method example can include forming conductive traces on the build-up layers.

Figure 11:
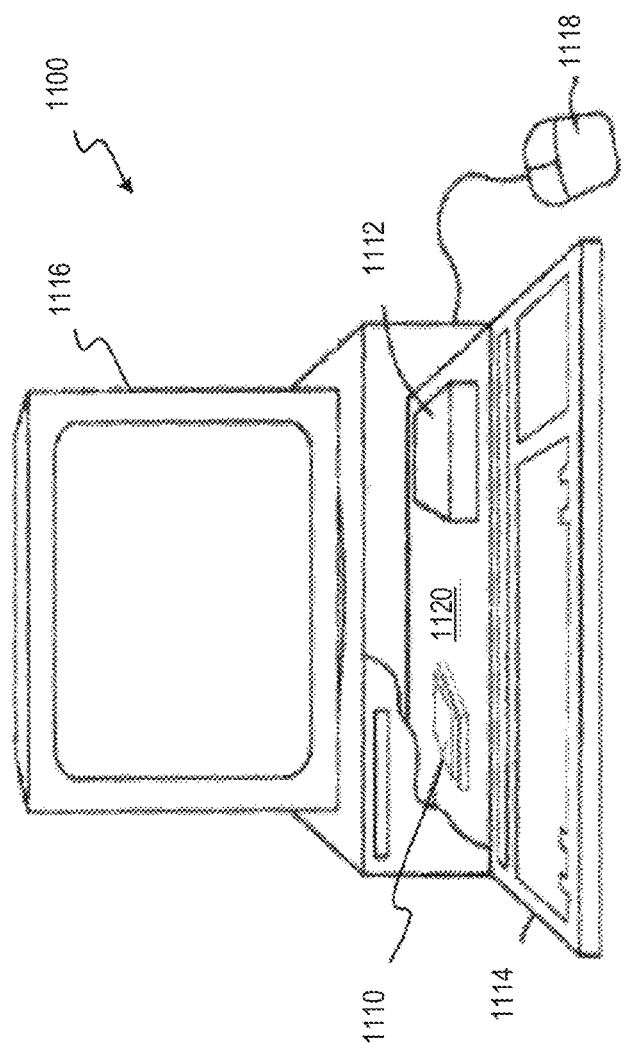
FIG. 11 depicts a computing system according to an embodiment.

FIG. 11 depicts a computing system 1100 according to an example. One or more of the foregoing examples of socket assemblies, such as those manufactured according to a foregoing process, can be utilized in a computing system, such as computing system 1100 of FIG. 11. A socket manufactured according to a method embodiment alone or in combination with any other embodiment can be referred to as an example(s) configuration.

The computing system 1100 can include processor, which can be enclosed in an IC chip package 1110, a data storage system 1112, input device such as a keyboard 1114, and output device such as a monitor 1116. The computing system 1100 can include a processor that processes data signals and may include, for example, a microprocessor available from INTEL CORPORATION. In addition to the keyboard 1114, the computing system 1100 can include another user input device such as a mouse 1118.

The computing system 1100 embodying components in accordance with the claimed subject matter can include any system that utilizes a microelectronic device system, which may include, for example, the socket assemblies described above, such as those manufactured according to a method example, which can be coupled with data storage such as dynamic random access memory (DRAM), polymer memory, flash memory, and phase-change memory. Certain example(s) can be coupled with any combination of these by being coupled with a processor. Data storage can include an embedded DRAM cache on a die. Example(s) configuration coupled with the processor can be part of a system with an example(s) configuration coupled with the data storage of the DRAM cache. Example(s) configuration can be coupled with the data storage system 1112.

In an example, the computing system 1100 can also include a die that contains a digital signal processor (DSP), a micro controller, an application specific integrated circuit (ASIC), or a microprocessor. An example(s) configuration can be coupled with any combination of these by being coupled with a processor. For an example, a DSP can be part of a chipset that can include a stand-alone processor and the DSP as separate parts of the chipset on a board 1120. An example(s) configuration can be coupled with the DSP and a separate example(s) configuration can be present that can be coupled with the processor in the IC chip package 1110. Additionally in an example, an example(s) configuration can be coupled with a DSP that can be mounted on the same board 1120 as the IC chip package 1110. An example(s) configuration can be combined as set forth with respect to the computing system 1100, in combination with an example(s) configuration as set forth by the various examples of the socket assemblies manufactured according to a method example within this disclosure and their equivalents.

Examples set forth in this disclosure can be applied to devices and apparatuses other than a traditional computer. For example, a die can be packaged with an example(s) configuration and placed in a portable device such as a wireless communicator or a hand-held device such as a smart phone, a personal data assistant and the like. Another example can be a die that can be packaged with an example(s) configuration and placed in a vehicle such as an automobile, a locomotive, a watercraft, an aircraft, or a spacecraft.

Figure 12:
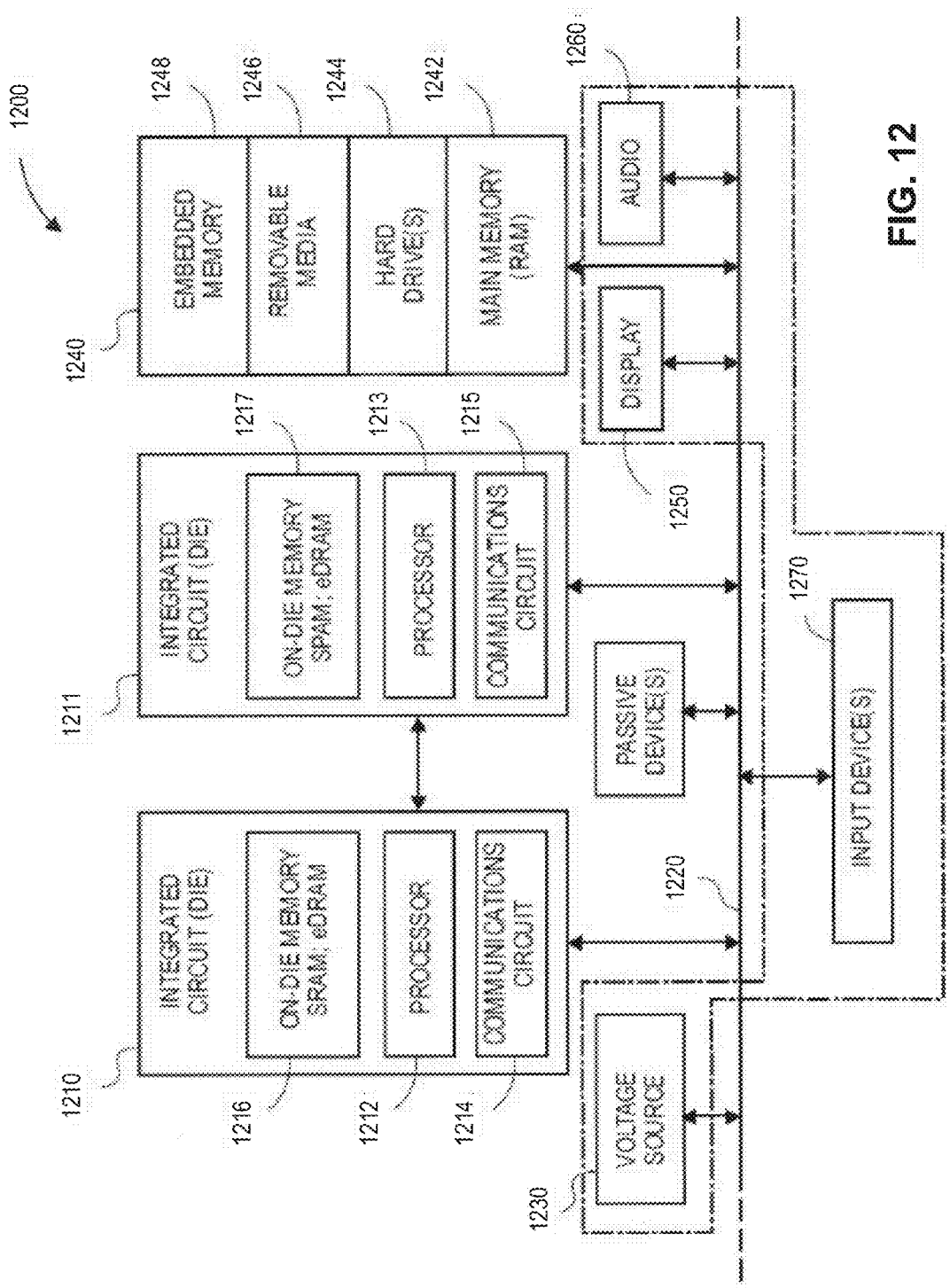
FIG. 12 is a diagram of a computer system, according to an embodiment.

FIG. 12 is a schematic of an electronic system 1200 according to an example. The electronic system 1200 as depicted can embody the computing system 1100 depicted in FIG. 11, with the electronic system can be depicted schematically. The electronic system 1200 incorporates electronic assembly 1210, such as an IC die illustrated above. In an example, the electronic system 1200 can be a computer system that can include a system bus 1220 to electrically couple the various components of the electronic system 1200. The system bus 1220 can be a single bus or any combination of busses according to various examples. The electronic system 1200 can include a voltage source 1230 that provides power to the integrated circuit 1210. In some examples, the voltage source 1230 supplies current to the integrated circuit 1210 through the system bus 1220.

The integrated circuit 1210 is electrically coupled with the system bus 1220 and includes any circuit or combination of circuits according to an example. In an example, the integrated circuit 1210 includes a processor 1212 that can be of any type. As used herein, the processor 1212 means any type of circuit such as, but not limited to, a microprocessor, a microcontroller, a graphics processor, a digital signal processor, or another processor. Accordingly, a socket can be part of the electronic system that seats two dice, such as a processor first die and a second die selected from a processor or another die that is part of a chipset. Other types of circuits that can be included in the integrated circuit 1210 are a custom circuit or an ASIC, such as a communications circuit 1214 for use in wireless devices such as cellular telephones, pagers, portable computers, two-way radios, and similar electronic systems. In an example, the integrated circuit 1210 includes on-die memory 1216 such as static random-access memory (SRAM). In an example, the integrated circuit 1210 includes on-die memory 1216 such as embedded dynamic random-access memory (eDRAM).

In an example, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital video disks (DVDs), flash memory keys, and other removable media known in the art.

In an example, the electronic system 1200 also includes a display device 1250 and an audio output 1260. In an example, the electronic system 1200 includes an input 1270, such as a keyboard, mouse, trackball, game controller, microphone, voice-recognition device, or any other device that inputs information into the electronic system 1200.

As shown herein, integrated circuit 1210 can be implemented in a number of different examples, including an electronic package, an electronic system, a computer system, one or more methods of fabricating an integrated circuit, and one or more methods of fabricating an electronic assembly that includes the socket assemblies as set forth herein in the various examples and their art-recognized equivalents. The elements, materials, geometries, dimensions, and sequence of operations can all be varied to suit particular packaging requirements.

EXAMPLES AND NOTES

The present subject matter may be described by way of several examples. Example 1 includes subject matter (such as an apparatus, a method, a means for performing acts, or a device readable medium including instructions that, when performed by the device, can cause the device to perform acts) comprising a substrate with a release layer coupled with the substrate above the substrate. An Example can include an resin layer coupled with the release layer above the release layer. An Example can include a metal film coupled with the resin layer, above the resin layer, the metal film defining a cavity. An Example can include a microelectronic die coupled with the metal film in the cavity.

Example 2 can include, or can optionally be combined with the subject matter of Example 1 wherein the release layer is adhered to the substrate with a weak adhesion bond.

Example 3 can include, or can optionally be combined with the subject matter of one or any combination of Examples 1 through 2 wherein the weak adhesion bond is less than 0.2 kilogram-force per centimeter.

Example 4 can include, or can optionally be combined with the subject matter of one or any combination of Examples 1 through__ wherein the resin layer is adhered to the release layer with a weak adhesion bond.

Example 5 can include, or can optionally be combined with the subject matter of one or any combination of Examples 1 through__ wherein the substrate is formed of pre-impregnated composite.

Example 6 can include, or can optionally be combined with the subject matter of one or any combination of Examples 1 through__ wherein the die includes an active region and an inactive region, with the inactive region disposed against resin layer.

Example 7 can include, or can optionally be combined with the subject matter of one or any combination of Examples 1 through 6 including a plurality of build-up layers coupled with the metal film.

Example 8 can include, or can optionally be combined with the subject matter of one or any combination of Examples 1 through 7 including a plurality of conductive traces coupled with the build-up layers and in electrical communication with the active region.

Example 9 can include, or can optionally be combined with the subject matter of one or any combination of Examples 1 through 8 including a bottom release layer coupled with the substrate below the substrate, the release layer adhered to the substrate. An Example can include a bottom resin layer coupled with the release layer below the release layer, the resin layer coupled with the substrate. An Example can include a bottom metal film coupled with the resin layer, below the resin layer, the metal film defining a cavity. An Example can include a bottom microelectronic die coupled with the metal film in the cavity.

Example 10 can include, or can optionally be combined with the subject matter of one or any combination of Examples 1 through 9 including an encapsulation material surrounding the microelectronic die and filling the cavity.

Example 11 can include, or can optionally be combined with the subject matter of one or any combination of Examples 1 through 10 wherein the microelectronic die is a processor, and wherein the bottom die is selected from a data storage device, a digital signal processor, a micro controller, an application specific integrated circuit, and a processor.

Example 12 can include, or can optionally be combined with the subject matter of one or any combination of Examples 1 through 11 wherein the example is disposed in one of a computer, a wireless communicator, a hand-held device, an automobile, a locomotive, an aircraft, a watercraft, and a spacecraft.

Example 13 can include, or can optionally be combined with the subject matter of one or any combination of Examples 1 through__ wherein a portion of the metal film abuts the substrate, the portion surrounding the release layer.

Example 14 can include, or can optionally be combined with the subject matter of one or any combination of Examples 1 through 13 wherein the portion extends around a perimeter of the release layer.

Example 15 can include, or can optionally be combined with the subject matter of one or any combination of Examples 1 through 14 wherein the metal film is copper and the substrate is a pre-impregnated composite, and a bond between them has a peel strength of around 3.8 kilogram-force per centimeter.

Example 16 can include, or can optionally be combined with the subject matter of one or any combination of Examples 1 through__ wherein the metal film includes copper.

Example 17 can include, or can optionally be combined with the subject matter of one or any combination of Examples 1 through 16 wherein the copper is around 3 to 300 microns thick.

Example 18 can include, or can optionally be combined with the subject matter of one or any combination of Examples 1 through 17 wherein the copper is around 10-180 microns thick.

Example 19 can include, or can optionally be combined with the subject matter of one or any combination of Examples 1 through__ wherein the resin layer is around 1 to 100 microns thick.

Example 20 can include, or can optionally be combined with the subject matter of one or any combination of Examples 1 through__ wherein the release layer is less than around 0.5 nanometer to 50 micron thick.

Example 21 includes subject matter (such as an apparatus, a method, a means for performing acts, or a device readable medium including instructions that, when performed by the device, can cause the device to perform acts) comprising coupling an resin layer onto a metal film. An Example can include coupling a release layer onto the resin layer. An Example can include adhering the release layer to a substrate with a weak adhesion bond. An Example can include etching the metal film, defining a cavity. An Example can include coupling a microelectronic die onto the metal film, inside the cavity.

Example 22 can include, or can optionally be combined with the subject matter of one or any combination of Examples 21 through 21 wherein coupling the resin layer onto the metal film includes spraying the resin layer onto the metal film.

Example 23 can include, or can optionally be combined with the subject matter of one or any combination of Examples 21 through 22 wherein coupling the resin layer onto the metal film includes spraying the resin layer onto the metal film in a pattern that covers less than an entire surface of the metal film.

Example 24 can include, or can optionally be combined with the subject matter of one or any combination of Examples 21 through 23 including coupling the release layer onto the resin layer in a patter than covers and entire exposed surface of the resin layer.

Example 25 can include, or can optionally be combined with the subject matter of one or any combination of Examples 21 through 24 wherein coupling the resin layer onto the metal film includes rolling the resin layer from a roll of resin layer onto the metal film.

Example 26 can include, or can optionally be combined with the subject matter of one or any combination of Examples 21 through 25 wherein coupling the resin layer onto the metal film includes rolling the resin layer onto the metal film in a pattern that covers less than an entire surface of the metal film, including periodically cutting the roll.

Example 27 can include, or can optionally be combined with the subject matter of one or any combination of Examples 21 through 21 including coupling a primer on the resin layer can include, or can optionally be combined with the subject matter of one or any combination of Examples 21 through 26 wherein coupling the release layer onto the resin layer includes coupling the release layer onto the primer.

Example 28 includes subject matter (such as an apparatus, a method, a means for performing acts, or a device readable medium including instructions that, when performed by the device, can cause the device to perform acts) comprising coupling a top resin onto a top metal film. An Example can include coupling a top release layer onto a top resin layer. An Example can include coupling a bottom resin onto a bottom metal film. An Example can include coupling a bottom release layer onto a bottom resin layer. An Example can include adhering the top release layer to a top surface of a substrate with a weak adhesion bond. An Example can include adhering the bottom release layer to a bottom surface of a substrate with a weak adhesion bond. An Example can include etching the top metal film, defining a top cavity. An Example can include etching the bottom metal film, defining a bottom cavity. An Example can include coupling a top microelectronic die on the top metal film in the top cavity. An Example can include coupling a bottom microelectronic die on the bottom metal film in the bottom cavity. An Example can include cutting the top metal film, top release layer, top resin, bottom metal film, bottom release layer, bottom resin and substrate, with a cut line disposed between a portion of the top resin layer that is coupled with the substrate and between a portion of the bottom resin layer that is coupled with the substrate. An Example can include overcoming the weak adhesion bond separating the top release layer from the top surface of the substrate. An Example can include overcoming the weak adhesion bond separating the bottom release layer from the bottom surface of the substrate.

Example 29 can include, or can optionally be combined with the subject matter of one or any combination of Examples_through 28 wherein adhering the top release layer to a top surface of a substrate with a weak adhesion bond includes pressing the top release layer to the top surface of the substrate under a pressure at a temperature in excess of an ambient temperature, and wherein adhering the bottom release layer to a bottom surface of a substrate with a weak adhesion bond includes concurrently pressing the bottom release layer to the bottom surface of the substrate under the same pressure and temperature.

Example 30 can include, or can optionally be combined with the subject matter of one or any combination of Examples_through 29 including encapsulating the top die in the top cavity, and encapsulating the bottom die in the bottom cavity.

Example 31 can include, or can optionally be combined with the subject matter of one or any combination of Examples_through 30 including building up build-up layers onto the top metal film and the bottom metal film.

Example 32 can include, or can optionally be combined with the subject matter of one or any combination of Examples_through 31 including forming conductive traces on the build-up layers.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a first substrate;
   a release layer coupled with the first substrate above the first substrate;
   a resin layer coupled with the release layer above the release layer;
   a metal film coupled with the resin layer, above the resin layer at a bottom surface of the metal film, the metal film including a cavity therein, the cavity extending from a top surface of the metal film through the bottom surface of the metal film to the resin layer;
   a microelectronic die coupled with the metal film in the cavity; and
   a first bumpless buildup layer substrate coupled with an active surface of the die above the die
   wherein the first substrate includes a first substrate cavity extending from a top surface of the first substrate and into the first substrate, the release layer is situated in the first substrate cavity, and the resin layer is situated in the first substrate cavity, and
   wherein a top surface of the first resin layer is generally co-planar with a top surface of the first substrate.

2. The apparatus of claim 1, wherein the release layer is adhered to the first substrate with a weak adhesion bond.

3. The apparatus of claim 1, wherein the resin layer is adhered to the release layer with a weak adhesion bond.

4. The apparatus of claim 1, wherein the first substrate is formed of one of an organic composite, an inorganic composite, a combination of organic and inorganic composites and a monolithic layer.

5. The apparatus of claim 1, comprising:
   a bottom release layer coupled with the first substrate below the first substrate, the release layer adhered to the first substrate;
   a bottom resin layer coupled with the release layer below the release layer, the resin layer coupled with the release layer;
   a bottom metal film coupled with the resin layer, below the resin layer, the metal film defining a cavity; and
   a bottom microelectronic die coupled with the metal film in the cavity.

6. The apparatus of claim 5, comprising an encapsulation material surrounding the bottom microelectronic die and filling the cavity.

7. The apparatus of claim 6, wherein the microelectronic die is a processor, and wherein the bottom die is selected from a data storage device, a digital signal processor, a micro controller, an application specific integrated circuit, and a processor.

8. The apparatus of claim 7, wherein the apparatus is disposed in one of a computer, a wireless communicator, a hand-held device, an automobile, a locomotive, an aircraft, a watercraft, and a spacecraft.

9. The apparatus of claim 1, wherein a portion of the metal film abuts the first substrate, the portion surrounding the release layer.

10. The apparatus of claim 1, wherein the resin layer is inside a perimeter of the metal film and not coextensive with the metal film.

11. The apparatus of claim 10, wherein the release layer is inside a perimeter of the resin layer and not coextensive with the resin layer.

12. The apparatus of claims 5, further comprising a second bumpless buildup layer substrate coupled with an active surface of the bottom microelectronic die above the bottom microelectronic die.

13. The apparatus of claim 1, wherein the release layer is a first release layer, the resin layer is a first resin layer, the metal film is a first metal film, and the microelectronic die is a first microelectronic die, the first substrate includes a second substrate cavity extending from a bottom surface of the first substrate and into the first substrate so that the substrate is generally "I" shaped, and wherein the apparatus further comprises:
   a second release layer a release layer coupled with the first substrate in the second cavity;
   a second resin layer coupled with the second release layer on the second release layer;
   a second metal film coupled with the second resin layer, on the resin layer at a bottom surface of the second metal film, the second metal film including a second metal film cavity therein, the second metal film cavity extending from a top surface of the second metal film through the bottom surface of the second metal film to the second resin layer; and
   a second microelectronic die coupled with the second metal film in the second metal film cavity.

14. The apparatus of claim 13, wherein a bottom surface of the second resin layer is generally co-planar with a bottom surface of the first substrate.

* * * * *